United States Patent
Alrod et al.

(10) Patent No.: US 7,821,839 B2
(45) Date of Patent: Oct. 26, 2010

(54) GAIN CONTROL FOR READ OPERATIONS IN FLASH MEMORY

(75) Inventors: Idan Alrod, Herzliya (IL); Eran Sharon, Rishon Lezion (IL)

(73) Assignee: SanDisk IL Ltd., Kfar Saba (IL)

(*) Notice: Subject to any disclaimer, the term of this patent is extended or adjusted under 35 U.S.C. 154(b) by 112 days.

(21) Appl. No.: 12/251,854

(22) Filed: Oct. 15, 2008

(65) Prior Publication Data

US 2009/0323422 A1 Dec. 31, 2009

Related U.S. Application Data

(60) Provisional application No. 61/076,315, filed on Jun. 27, 2008.

(51) Int. Cl.
G11C 11/34 (2006.01)
G11C 16/04 (2006.01)
(52) U.S. Cl. .................. 365/185.24; 365/33
(58) Field of Classification Search ............ 365/185.24, 365/185.33
See application file for complete search history.

(56) References Cited

U.S. PATENT DOCUMENTS

| | | | |
|---|---|---|---|
| 6,169,691 B1 | 1/2001 | Pasotti | |
| 6,751,766 B2 | 6/2004 | Guterman | |
| 6,859,391 B1 | 2/2005 | Combe et al. | |
| 7,020,017 B2 | 3/2006 | Chen et al. | |
| 7,085,183 B2 | 8/2006 | Yang et al. | |
| 7,167,395 B1 | 1/2007 | Kobernik et al. | |
| 7,187,585 B2 | 3/2007 | Li et al. | |
| 7,212,435 B2 | 5/2007 | Rudeck et al. | |
| 7,259,993 B2 | 8/2007 | Redaelli et al. | |
| 7,310,271 B2 | 12/2007 | Lee | |
| 7,729,175 B2 * | 6/2010 | Cho et al. | 365/185.24 |
| 2006/0279990 A1 | 12/2006 | Wan et al. | |
| 2007/0242510 A1 | 10/2007 | Hemink | |
| 2007/0242524 A1 | 10/2007 | Hemink | |

OTHER PUBLICATIONS

U.S. Appl. No. 11/941,946, filed Nov. 18, 2007, titled "Adaptive Dynamic Reading of Flash Memories".
Bloom et al., Saifun Semiconductors Limited, "NROM: Nitride-Based NVM Technology," Tutorial G, Science and Technology of Nonvolatile Memories, MRS Symposium Apr. 2006 (p. 15).

* cited by examiner

Primary Examiner—Ly D Pham
(74) Attorney, Agent, or Firm—Vierra Magen Marcus & DeNiro LLP

(57) ABSTRACT

A technique for performing read operations with reduced errors in a memory device such as flash memory. An automatic gain control approach is used in which cells which have experienced data retention loss are read by a fine M-level quantizer which uses M−1 read threshold voltage levels. In one approach, M-quantized threshold voltage values are multiplied by a gain to obtain gain-adjusted threshold voltage values, which are quantized by an L-level quantizer, where L<M, by comparing the gain-adjusted threshold voltage values to read threshold voltage levels of a fresh memory device. In another approach, the read threshold voltage levels of the fresh device are gain adjusted for reading non-gain-adjusted threshold voltage values from the cells which have experienced data retention loss.

15 Claims, 12 Drawing Sheets

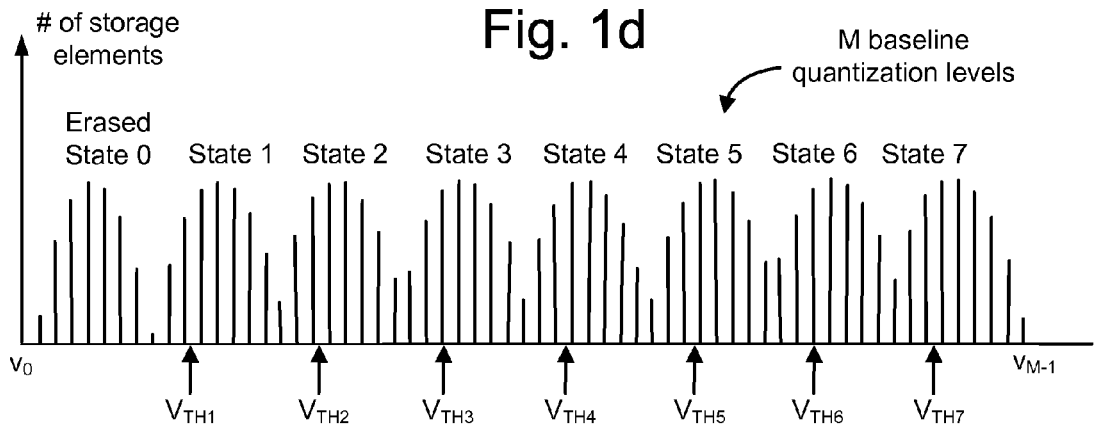
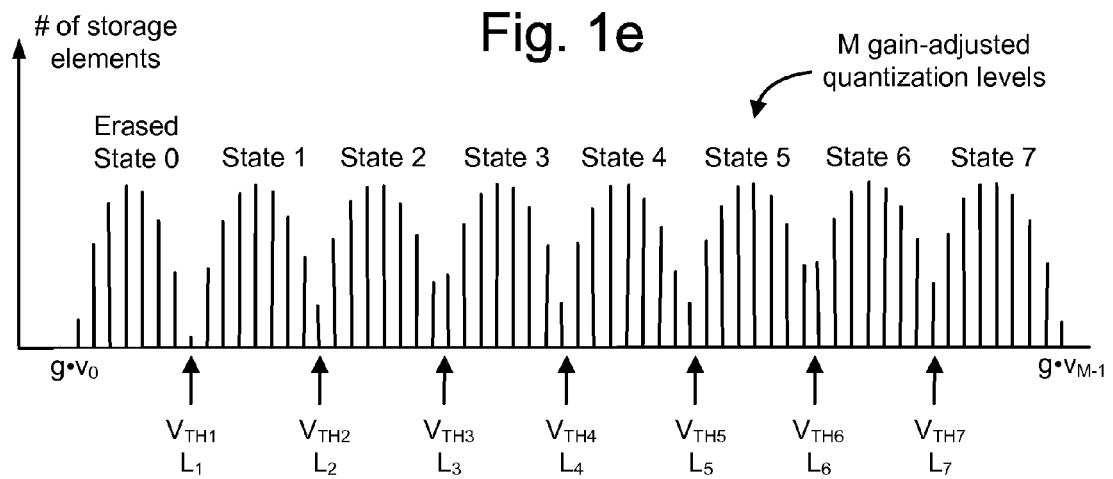

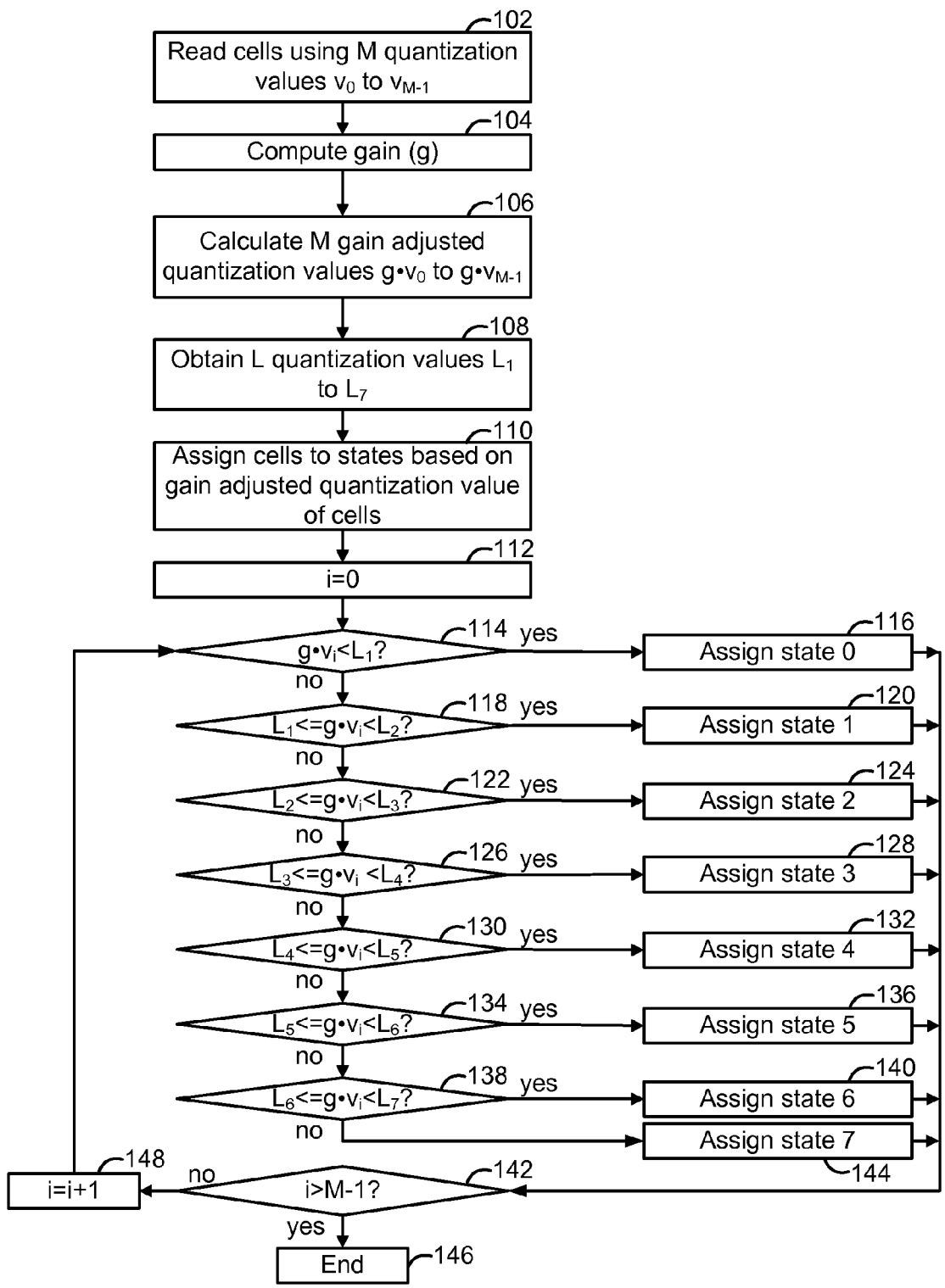

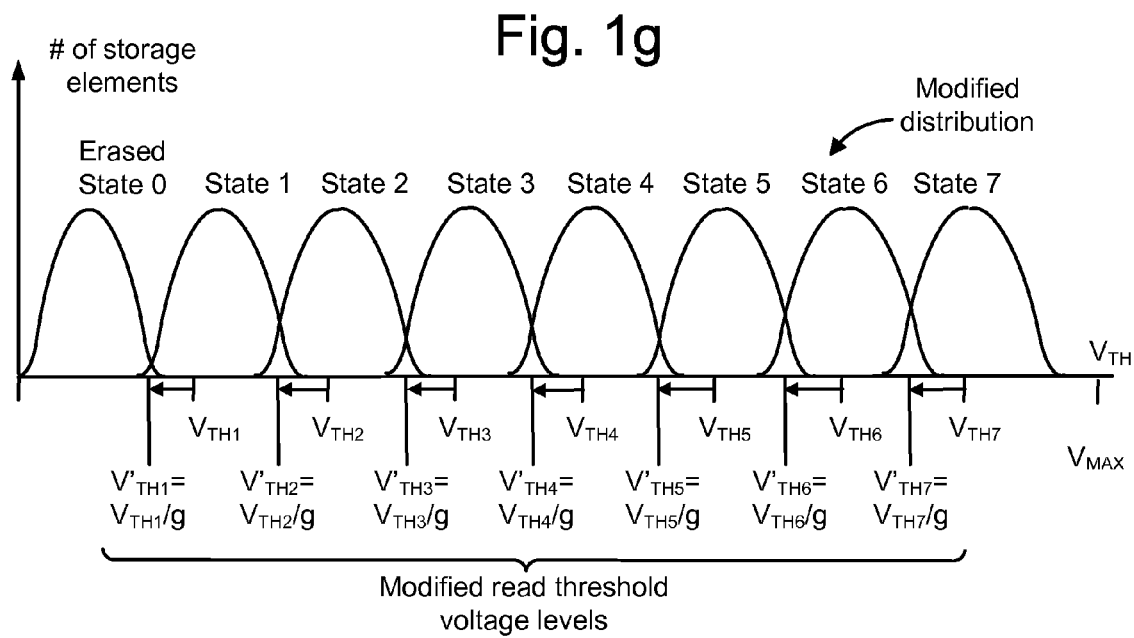

US 7,821,839 B2

GAIN CONTROL FOR READ OPERATIONS IN FLASH MEMORY

CROSS-REFERENCE TO RELATED APPLICATIONS

This application claims the benefit of U.S. provisional application No. 61/076,315, filed Jun. 27, 2008, incorporated herein by reference.

BACKGROUND OF THE INVENTION

1. Field of the Invention

The present invention relates to a memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. Flash includes NAND and NOR technologies. During a read operation in such devices, a series of read reference voltages are applied to a set of storage elements to be read, and a determination is made as to which read reference voltage causes a storage element to become conductive. The read reference voltages are set to allow different data states of the storage elements to be distinguished.

However, techniques are needed to improve the accuracy of read operations, particularly as it is desired to put more states into the same voltage window.

SUMMARY OF THE INVENTION

The present invention provides a method and system for performing read operations with reduced errors in a non-volatile storage system or also, optionally, improving the read thresholds employed by using a gain to change the original read reference levels.

In one embodiment, a method of reading data from a unit of a flash memory device includes: (a) reading data from cells of the flash using a first quantizer with (M−1) read threshold voltage levels, thereby assigning to each read cell a representation value from a predefined set of M values, (b) modifying the representation value of each cell in the read unit, thereby generating modified representation values for each cell, and (c) assigning a read threshold voltage value for each cell, each read threshold voltage value computed as a function of the modified representation value associated with the cell and a set of predefined (L−1) read threshold voltage levels, where L is less than M.

In another embodiment, a method of reading data from a unit of a flash memory device includes: (a) reading data from cells of the flash using a first quantizer with (M−1) read threshold voltage levels, thereby assigning to each set of N read cells a representation vector from a predefined set of $M^N$ vectors, (b) modifying the representation vector of each set of N cells in the read unit, thereby generating a modified representation vector for each set of N cells, and (c) assigning a vector of read values for each set of N cells, each vector of read values is computed as a function of the modified representation vector associated with the set of N cells and a set of predefined L read threshold vectors, where L is less than $M^N$.

In another embodiment, a method of reading data from a unit of a flash memory device includes: (a) reading data from cells of the flash using a quantizer with (M−1) read threshold voltage levels, thereby assigning to each cell in the page a representation value from a predefined set of M values, (b) based on the representation values compute a set of (L−1) read threshold voltage levels where L is less than M, and (c) assigning a read threshold voltage value to each cell in the unit, the read threshold voltage value is taken from a set of L values and computed as a function of the representation value of the cell and the (L−1) read threshold voltage levels.

In another embodiment, a method of reading data from a unit of a flash memory device includes: (a) reading data from cells of the flash using a quantizer with (M−1) read threshold voltage levels, thereby assigning to each set of N read cells a representation vector from a predefined set of $M^N$ vectors, (b) based on the representation vector compute a set of L read threshold voltage levels where L is less than $M^N$, and (c) assigning a vector of read threshold voltage values to each set of N cells in the unit, each vector of read threshold voltage values is taken from a set of L read threshold vectors and computed as a function of the representation vector of the N cells and the L read threshold voltage levels.

In another embodiment, a memory device includes cells for storing data, and at least one control. The at least one control: (a) reads data from the cells using a first quantizer with (M−1) read threshold voltage levels, thereby assigning to each read cell a representation value from a predefined set of M values, (b) modifies the representation value of each cell in the read unit, thereby generating modified representation values for each cell, and (c) assigns a read threshold voltage value for each cell, each read threshold voltage value computed as a function of the modified representation value associated with the cell and a set of predefined (L−1) read threshold voltage levels, where L is less than M.

Corresponding methods, systems and computer- or processor-readable storage devices which store code which, when executed by at least one computer or processor, performs the methods provided herein, may be employed.

BRIEF DESCRIPTION OF THE DRAWINGS

FIG. 1d depicts M-level quantization for the threshold voltage distribution of FIG. 1b.

FIG. 1e depicts M gain-adjusted quantization levels based on the M original quantization levels of FIG. 1e.

FIG. 1f depicts a read process in which threshold voltages of storage elements are gain-adjusted for compatibility with baseline read threshold voltage levels.

FIG. 1g depicts L gain-adjusted read threshold voltage levels based on the L baseline read threshold voltage levels of FIG. 1b.

FIG. 2b is an equivalent circuit diagram of the NAND string of FIG. 2a.

DETAILED DESCRIPTION

The present invention provides a method and system for performing read operations with reduced errors in a non-volatile storage system or also, optionally, improving the read thresholds employed by using a gain to change the original read reference levels.

Figure 1A:
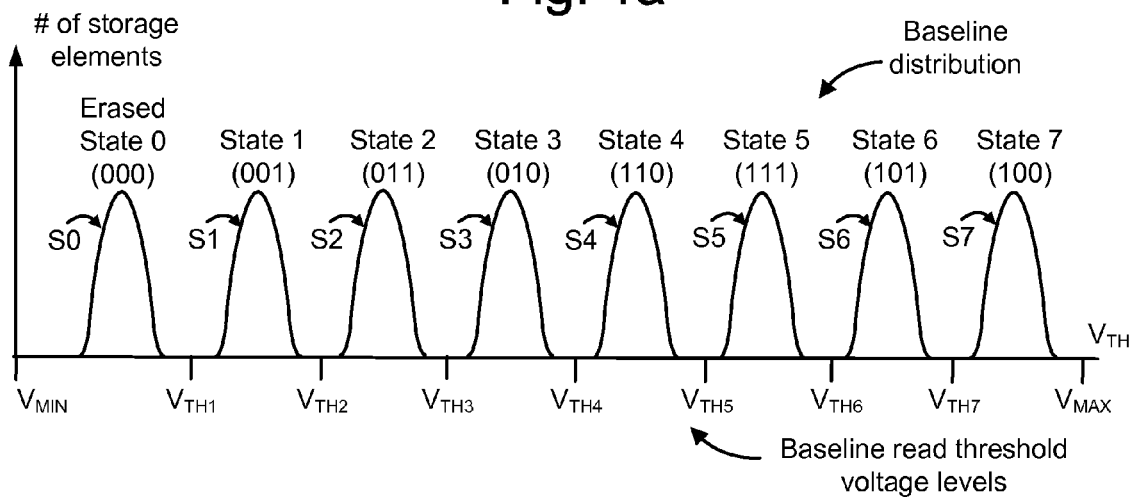
FIG. 1a depicts a baseline threshold voltage distribution of a set of storage elements and a corresponding assignment to L data states based on baseline read threshold voltage levels.

FIG. 1a depicts an original threshold voltage distribution of a set of storage elements and a corresponding assignment to L data states based on baseline read threshold voltage levels. An original or baseline threshold voltage ($V_{TH}$) distribution which exists after a set of storage elements, or cells, is programmed, but before the storage elements have been affected by data retention loss and program/erase cycles which alter the distribution. The distribution is also referred to as a cell voltage distribution (CVD) or probability density function (PDF).

For historical reasons, writing data to a flash cell is called "programming" the flash cell. The terms "writing" and "programming" are used interchangeably herein. This is done by applying voltage pulses to the cell, to inject electrons from the cell's silicon substrate through the cell's oxide layer into the cell's floating gate, until the threshold voltage of the cell is high enough within the voltage window to represent the desired bit pattern. The threshold voltage of a flash cell is in a range, called the "voltage window," as shown in FIG. 1a, from a minimum value $V_{MIN}$ to a maximum value $V_{MAX}$. For example, in a three-bit-per-cell memory, the voltage window is divided into eight voltage bands: from $V_{MIN}$ to $V_{TH1}$, from $V_{TH1}$ to $V_{TH2}$, from $V_{TH2}$ to $V_{TH3}$, from $V_{TH3}$ to $V_{TH4}$, from $V_{TH4}$ to $V_{TH5}$, from $V_{TH5}$ to $V_{TH6}$, from $V_{TH6}$ to $V_{TH7}$ and from $V_{TH7}$ to $V_{MAX}$. $V_{TH1}$, $V_{TH2}$, and so forth represent read threshold voltage levels which are also known as read compare points. A threshold voltage within one of the voltage bands represents a bit pattern as shown in FIG. 1a: a threshold voltage between $V_{MIN}$ and $V_{TH1}$ represents the bit pattern "000", a threshold voltage between $V_{TH1}$ and $V_{TH2}$ represents the bit pattern "001", and so forth In general, the voltage window of an m-bit-per-cell memory is divided into $2^m$ voltage bands. In this case, a three-bit Gray Code is used for the states so that a read error would cause one failed bit.

To read a flash cell, the threshold voltage of the flash cell is compared to the read threshold voltage levels that define the voltage bands. In the case of some flash memories (hereinafter called "type 1" memories), reading a cell that stores a bit pattern of m bits requires m such comparisons. For example, when m=3, and there are $2^m$=8 states, as illustrated in FIG. 1a, the threshold voltage first is compared to $V_{TH4}$. Depending on the outcome of that comparison, the threshold voltage is compared to either $V_{TH2}$ or $V_{TH6}$. Depending on the outcome of the second comparison, the threshold voltage is compared to either $V_{TH1}$ or $V_{TH3}$ or $V_{TH5}$ or $V_{TH7}$. Note that this comparison does not assume prior knowledge of the threshold voltage: circuitry in the flash memory returns a signal indicating whether the threshold voltage is higher or lower than the read threshold voltage level to which it is being compared.

In the case of some other flash memories (hereinafter called "type 2 memories"), the threshold values of all the cells that are read collectively are compared to all $2^m$-1 read threshold voltage levels between $V_{MIN}$ and $V_{MAX}$.

In a collection of flash cells, the threshold voltages of the cells are distributed statistically around the centers of their respective voltage bands. FIG. 1a shows the threshold voltages in the first, second, third, fourth, fifth, sixth, seventh and eighth voltage bands distributed according to the distribution curves S0 (state 0), S1 (state 1), S2 (state 2), S3 (state 3), S4 (state 4), S5 (state 5), S6 (state 6), S7 (state 7) and S8 (state 8), respectively.

There are several reasons for the finite widths of these distributions:

1. The programming process is a stochastic one that relies on inherently physical characteristics. Among them are quantum effects such as tunneling and electron hot injection.
2. The precision of the read/program circuitry is finite and is limited by random noise.
3. In some flash technologies, the threshold voltage of a cell being read is affected by the threshold voltages of neighboring cells.
4. Chip-to-chip variations and variations in the manufacturing process cause some cells to behave differently than other cells when read/programmed.

In addition, the threshold voltage distributions tend to change over time, as follows:

1. As a flash memory is programmed and erased, the voltage distribution tends to expand and hence the overlap between voltage bands increases. This phenomenon limits the number of times a flash memory cell can be erased and re-programmed.
2. The threshold voltage of a flash cell that is not programmed during a long period of time tends to drift downward. This phenomenon limits the time that data can be reliably retained in a flash memory. Hence the ability of flash cell to hold data for a period of time is also referred to data retention. The drift is caused by leakage current from the cell, as electrons trapped in the floating gate "jump" back to the substrate.

The voltage bands of a flash cell are usually designed to be wide enough to accommodate all the above mentioned phenomena, but not too wide. A voltage band that is too narrow, relative to the associated threshold voltage distribution curve and relative to the drift of that curve over time, leads to an unacceptably high bit error rate. On the other hand, making the voltage bands very wide relative to the associated threshold voltage distributions limits the number of bits that can be stored in the flash cell.

In practice, flash memories are designed to allow one bit error per a specified number of bits read, e.g., $10^{13}$-$10^{16}$ bits read. Some flash technologies are unable to achieve this error rate while storing the desired number of bits per cell. Some flash memories use error correction circuits to compensate for their high intrinsic error rates. Some NAND flash manufacturers have instructed their customers to incorporate error-correcting code in their applications.

The problem of determining the optimal location of read threshold voltage levels for reading the contents of flash memory cells becomes especially acute when the number of programming levels increases. The reason is: When the number of levels is large, any inaccuracies in estimation of the information stored in the cells results in superfluous errors that can affect the reliability of data read from the memory.

The central problem in finding optimal read threshold voltage levels is that threshold voltages of the cells are not constant. Threshold voltage may vary as a function of retention time, number of program/erase (P/E) cycles, as well as depend on particular production wafer, lot, chip, block, word and bit line. Therefore the behavior of the threshold voltage level of a certain cell can be predicted only statistically.

A standard procedure for reading the contents of cells compares the cell voltage with fixed read threshold voltage levels. The number of read threshold voltage levels is one less than the number of programmed states, as illustrated by the read threshold voltage levels $V_{TH1}$-$V_{TH7}$ in FIG. 1a, if "hard" information is used in processing (i.e., estimation of the stored bits without reference to the reliability of the estimation). Otherwise, the number of reference threshold voltage levels is larger. See, e.g., Guterman et al., U.S. Pat. No. 6,751,766, incorporated herein by reference, for an example of the use of more reference threshold voltage levels than programmed states to estimate the reliability of read bits.

Several approaches can be used for defining read threshold voltage levels. The simplest approach relies on placing the read threshold voltage levels at fixed baseline values that are derived based on theoretical and practical models following from measurements of flash devices. Such models allow minimization of the error probability in determining the correct programmed state.

Figure 1B:
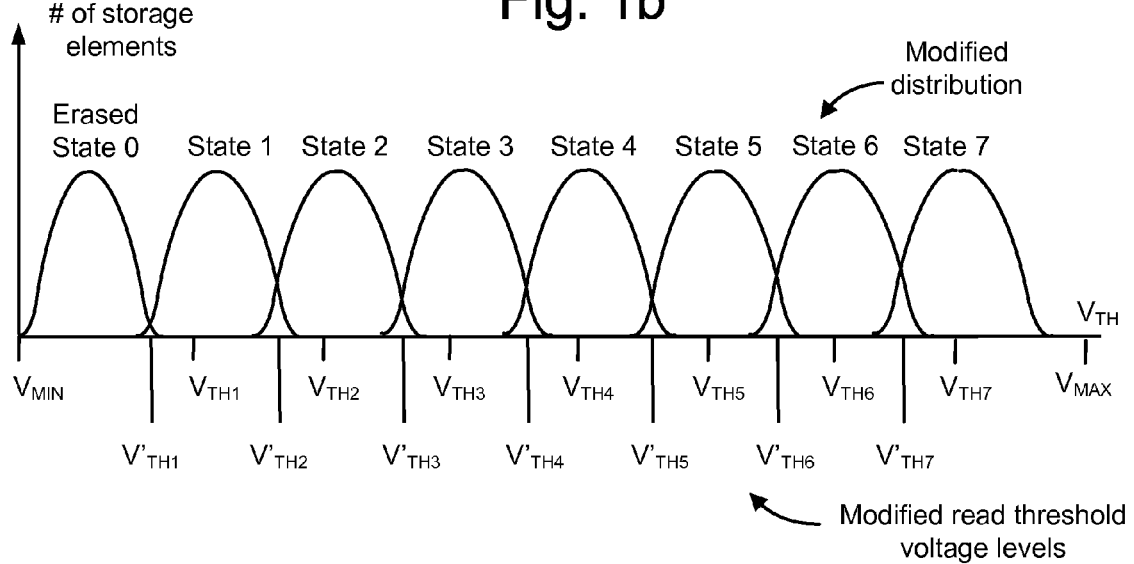
FIG. 1b depicts a modified threshold voltage distribution of a set of storage elements after experiencing program/erase (P/E) cycles and data retention (D/R) loss.

FIG. 1b depicts a modified threshold voltage distribution of a set of storage elements after experiencing program/erase (P/E) cycles and data retention (D/R) loss. Here, the threshold voltage distribution is modified relative to the baseline distribution of FIG. 1a due to effects such as data retention loss in which charge leaks out from the floating gates of the cells. The threshold distribution for each state is generally widened, e.g., in the directions of lower and higher $V_{TH}$ values for cells with a positive $V_{TH}$ or a negative $V_{TH}$, respectively. Generally, most of the data states are associated with a positive $V_{TH}$. Widening to the left, in the direction of decreasing $V_{TH}$, as depicted in FIG. 1b, is more severe when D/R loss is present in addition to program/erase cycles (P/E) cycles. Some overlap between states can occur. As a result, using the baseline read threshold voltage levels $V_{TH1}$-$V_{TH7}$ would result in significant read errors. Instead, modified read threshold voltage levels denoted by $V'_{TH1}$-$V'_{TH7}$ are more appropriate and would result in a high level of read accuracy. Here, for each state, the modified read threshold voltage level is lower than the corresponding baseline read threshold voltage level.

Clearly, instead of using the baseline read threshold voltage levels, the optimal read threshold reference voltage levels can be set according to the current probability density functions (PDFs) after P/E cycles and D/R loss are experienced. However, use of such modified read threshold voltage levels might increase the error probability if used in reading freshly programmed memory cells which have not experienced P/E cycles and D/R loss. Moreover, the models yielding PDFs are not accurate and actual behavior of flash voltages can essentially differ from the behavior predicted by such a model.

Note that an energy metric E can be defined which indicates the total energy or amount of charge which is present in a set of cells such as in a word line. Such a metric can be defined using a norm function, for instance, as discussed further below. The energy of a fresh memory device, which has zero or few P/E cycles, such as represented by the baseline threshold voltage distribution of FIG. 1a, may be defined as $E_{FRESH}$ while the energy of a memory device which has experienced charge leakage, such as represented by the modified threshold voltage distribution of FIG. 1b, may be defined as $E_{LEAK}$, where as $E_{LEAK} < E_{FRESH}$.

Figure 1C:
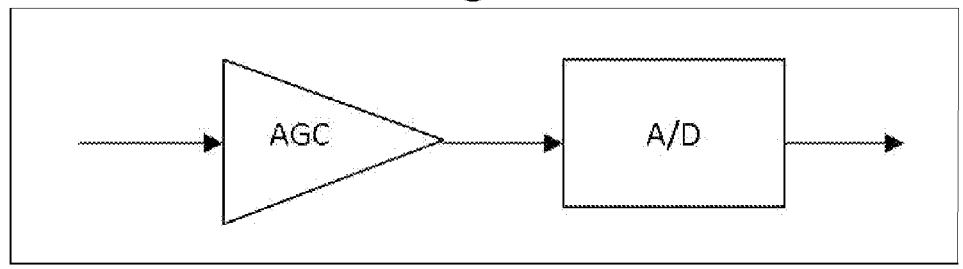
FIG. 1c depicts an automatic gain control (AGC) and analog-to-digital (A/D) converter configuration.

FIG. 1c depicts an automatic gain control (AGC) and analog-to-digital (A/D) converter configuration. A solution described herein for accurately reading memory cells is based on communication systems, and in particular, the interface between the analog and the digital parts of a communications system. A common scheme of a communications receiver is depicted. Here, an analog signal at the A/D converter input translates into a quantized digital signal at the A/D output. Typically, the A/D converter has a fixed number of decision regions, such that every sample of the analog signal translates into one of L representative values. This is referred to as L-level quantization.

It is desired that the input signal occupies most of the representative levels of the A/D converter. A weak analog signal may occupy only a few of the low level representative values, and as a result the signal suffers from a high quantization noise level, while a strong signal may cause saturation of the A/D converter. Therefore, an Automatic Gain Control (AGC) unit is added prior to the A/D converter input to amplify/attenuate the signal at the A/D input to the desired voltage range. A gain g>1 represents amplification, and g<1 represents attenuation.

The principles of an AGC can be applied to read operations in memory technology such as flash memory.

An example of a method for reading a set of memory cells using an AGC proceeds as follows:

1. Read the set of cells with a fine M-quantizer employing M−1 read threshold voltage levels separating M voltage regions. See FIG. 1d, which depicts M baseline quantization levels as hash marks along the x-axis for the threshold voltage distribution of FIG. 1b. The quantization levels are voltage levels $v_0$ through $v_{M-1}$. The output of the M-quantizer is the counterpart of the analog signal at the AGC input. Reading with M−1 decision thresholds corresponds to reading with more read threshold voltage levels than programming states, as mentioned above in connection with U.S. Pat. No. 6,751,766. As an example, six bit quantization can be used in which case $\log_2 M=6$ and M=64. The six bits include three hard bits and three soft bits.

2. Multiply the M-quantizer output values by a gain control number g. Determination of g is discussed in further detail below. Generally, g represent a ratio of $E_{FRESH}$ to $E_{LEAK}$, where $E_{FRESH}$ represents the charge of a set of fresh storage element, before charge leakage, and $E_{LEAK}$ represents the current, diminished charge of the set of storage elements, after leakage has occurred. See FIG. 1e, which depicts M gain-adjusted quantization levels, which are the voltage levels $g \cdot v_0$ through $g \cdot v_{M-1}$. Voltage regions are between each baseline M quantization level in FIG. 1d so that, during the reading process, a cell which has a $V_{TH}$ in a given voltage region is assigned to a representation value which is at a lower end of the voltage region. For instance, a cell whose $V_{TH}$ is in the voltage region between original quantization values $v_{i+7}$ and $v_{i+8}$ is assigned to a value of $v_{i+}7$. Providing the gain-adjusted quantization levels $g \cdot v_0$ through $g \cdot v_{M-1}$ is the counterpart of applying the AGC in the communications system.

Note that the multiplication can be performed in a decimal domain in which a decimal equivalent of a quantization level is multiplied by g. This can be achieved, e.g., using a lookup table or a function to take care of the translation. In a further option, the gain can vary for different quantization levels, e.g., by defining a curve or function of gain vs. M quantization value. For example, we may have gain-adjusted quantization levels $g_0 \cdot v_0$, $g_1 \cdot v_1$, $g_2 \cdot v_2$, and so forth. Or, we may have different gains for different sets of quantization levels, e.g., $g_0$ for $v_0$-$v_{10}$, $g_1$ for $v_{11}$-$v_{20}$, $g_2$ for $v_{21}$-$v_{30}$ and so forth. Further, the sizes of the sets can vary so that we have, e.g., $g_0$ for $v_0$-$v_{10}$, $g_1$ for $v_{11}$-$v_{30}$, $g_2$ for $v_{31}$-$v_{60}$ and so forth. In another example, the gain can be optimized for each state. Also, the gain can be set separately and optimized for different word lines, blocks, devices, and so forth. The value of the gain to be applied can be determined in several ways, two examples of which are:

- a. Read the values of a set of cells with one or more predefined programmed states, e.g., read all S2 cells, or read all S2 cells, and so forth. Compute the gain according to the read threshold voltage values of the set of cells, such that after applying the gain, the difference between the (original) vector of programmed states of the set of cells, and the vector of modified read threshold voltage values has minimal distortion in some sense.
- b. Read the threshold voltage values of a randomly chosen set of cells. Compute a gain such that the vector of modified read threshold voltage values achieves some desired mean value.

3. Quantize the modified representative numbers with a second L-quantizer having L−1 read threshold voltage levels representing L programmed states, where L<M. This L-quantizer is the counterpart of the A/D in communication systems. For example, L=8 programmed states in the present example. Referring to FIG. 1e, $L_1$ to $L_7$ quantization levels can correspond roughly to the baseline read threshold voltage levels $V_{TH1}$ to $V_{TH7}$, respectively, in one possible approach. Cells which are M-quantized to a first set of gain-adjusted quantization levels which are less than $V_{TH1}$ are L-quantized to a representation value of state 0, cells which are M-quantized to a second set of gain-adjusted quantization levels which are between $V_{TH1}$ and $V_{TH2}$ are L-quantized to a representation value of state 1, cells which are M-quantized to a third set of gain-adjusted quantization levels which are between $V_{TH2}$ and $V_{TH3}$ are L-quantized to a representation value of state 2, and so forth. As a result, the cells are more accurately assigned to a corresponding state during a read process, thereby increasing read accuracy.

In the above approach, the set of cells is read once to obtain M representation values which correspond to the M quantization levels, the M representation values are gain-adjusted, and the M gain-adjusted representation values are assigned to L representation values such as the L data states S0-S7. The process is summarized in FIG. 1f.

FIG. 1f depicts a read process in which threshold voltages of storage elements are gain-adjusted for compatibility with baseline read threshold voltage levels. Step 102 includes reading a set of cells using M quantization values $v_0$ to $v_{M-1}$. These are read threshold voltage levels that a controller of the memory device may access from a local memory. For instance, there may be ten cells which are quantized to $v_0$, fourteen cells which are quantized to $v_1$ and so forth. The increment between the read threshold voltage levels can be fixed or varying. Step 104 includes computing the gain g, as detailed further below, from a vector which includes the M quantization values. Step 106 includes calculating M gain-adjusted quantization values $g_0 \cdot v_0$, $g_1 \cdot v_1$, $g_2 \cdot v_2$, and so forth. Step 108 includes obtaining L quantization values $L_1$ to $L_7$. These are voltage values that the controller may access from a local memory. Step 110 includes assigning the cells to states based on the gain-adjusted quantization value of a cell.

For example, a counter "i" can be initialized to zero at step 112. At decision block 114, if the gain-adjusted quantization value $g \cdot v_i$ for a cell is less than $L_1$, then the cell is assigned to state 0 (step 116). At decision block 118, if $L_1 <= g \cdot v_i < L_2$, then the cell is assigned to state 1 (step 120). At decision block 122, if $L_2 <= g \cdot v_i < L_3$, then the cell is assigned to state 2 (step 124). At decision block 126, if $L_3 <= g \cdot v_i < L_4$, then the cell is assigned to state 3 (step 128). At decision block 130, if $L_4 <= g \cdot v_i < L_5$, then the cell is assigned to state 4 (step 132). At decision block 134, if $L_5 <= g \cdot v_i < L_6$, then the cell is assigned to state 5 (step 136). At decision block 138, if $L_6 <= g \cdot v_i < L_7$, then the cell is assigned to state 6 (step 140). If decision block 138 is false, then the cell is assigned to state 7 (step 144). At decision step 142, if the (M−1)st gain-adjusted quantization value has not yet been reached, the counter "i" is incremented at block 148 and the assignment process starting at step 114 is repeated. If the last gain-adjusted quantization value has been reached, at decision step 142, the process ends at step 146. The controller may perform the above steps, in one possible approach.

In another possible approach, the set of cells is read to obtain M representation values which correspond to the M quantization levels, but the M representation values are not gain-adjusted. Instead, the L baseline read threshold voltage levels are gain-adjusted. The cells are then assigned to one of L states based on the gain-adjusted read threshold voltage levels. Alternatively, the set of cells can be read again using the L gain-adjusted read threshold voltage levels. These approaches are depicted in FIGS. 1g, 1h and 1i.

FIG. 1g depicts L gain-adjusted read threshold voltage levels $V_{TH1}/g$, $V_{TH2}/g$, and so forth which are based on the L baseline read threshold voltage levels of FIG. 1b. As can be seen, the baseline read threshold voltage levels are adjusted downward to be compatible with the threshold voltage distribution of the memory device which has experience data retention loss.

Figure 1H:
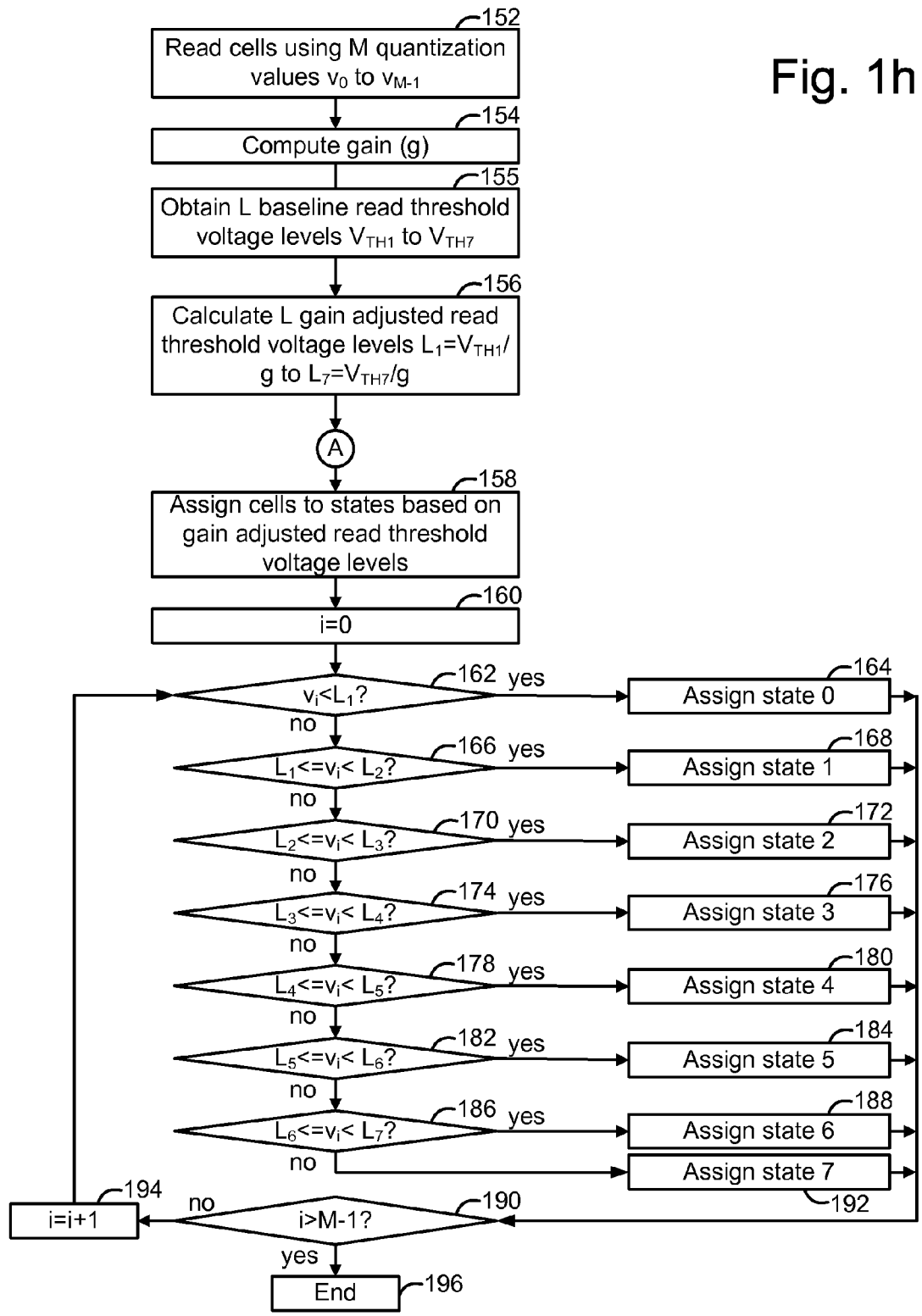
FIG. 1h depicts a read process in which read threshold voltage levels are gain-adjusted for compatibility with a modified threshold voltage distribution.
Figure 1I:
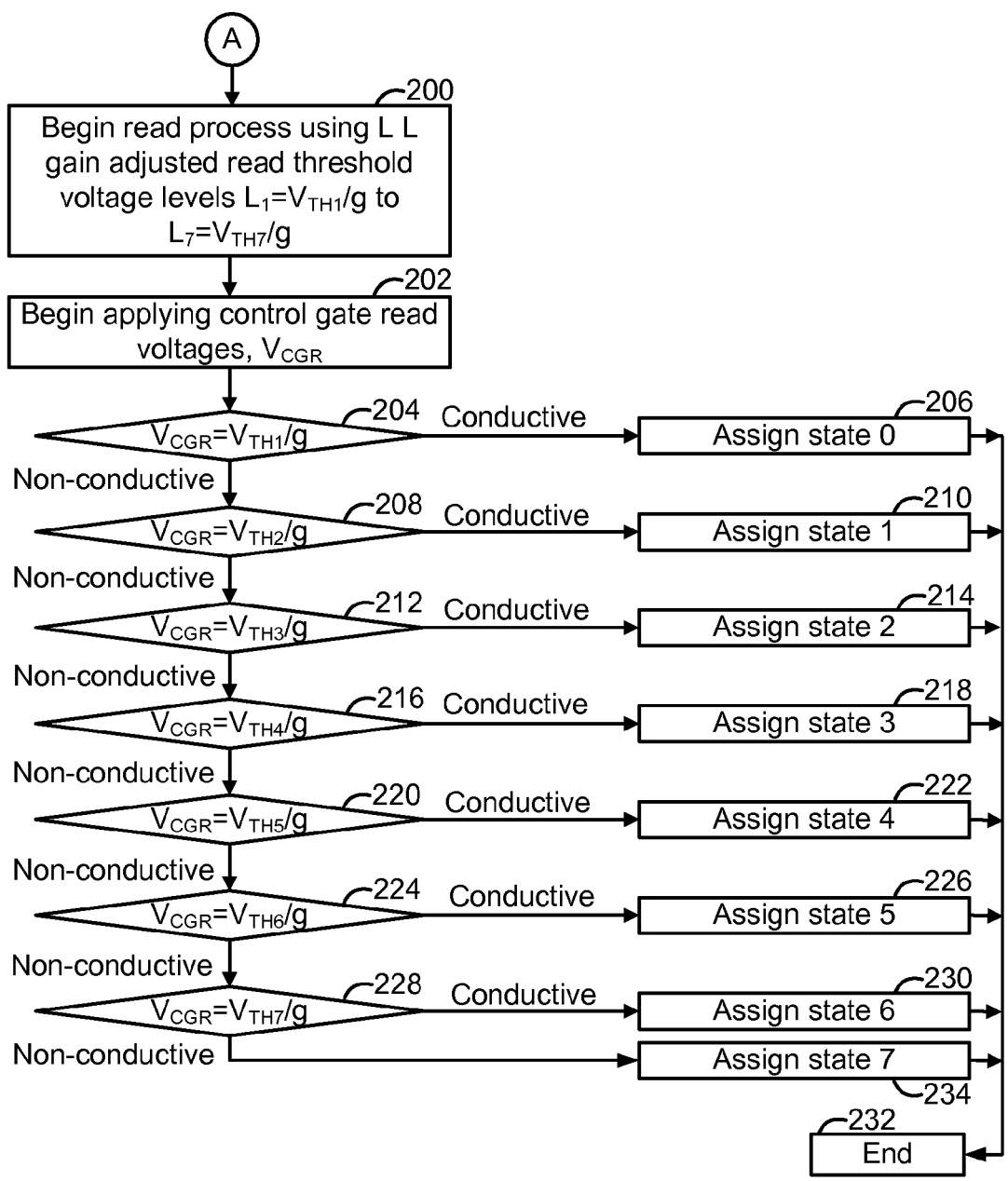
FIG. 1i depicts an alternative read process in which read threshold voltage levels are gain-adjusted for compatibility with a modified threshold voltage distribution.

FIG. 1h depicts a read process in which storage elements are assigned to states based on gain-adjusted read threshold voltage levels. This approach for reading a memory device involves the following:

1. Read the plurality of cells with a fine M-quantizer employing M−1 threshold voltage levels separating M voltage regions. The output of the M-quantizer is the counterpart of the analog signal at the AGC input.
2. Divide the M−1 threshold voltage levels of the M-quantizer by a Gain control number g to generate a set of M−1 modified threshold voltage levels. (This step has no counterpart in the communications system.) The value of the gain is computed as described herein. It may be sufficient to divide the maximal threshold voltage levels, and thus set the limits for the L-quantizer.
3. Based on the modified read threshold voltage levels, define a second L-quantizer having L−1 threshold voltage levels representing L voltage states where L<M. Typically, the L−1 threshold voltage levels are a subset of the M−1 modified threshold voltage levels of the M-quantizer. This L-quantizer is the counterpart of the A/D in communication systems.
4. Quantize the original read threshold voltage values of the plurality of cells with the L-quantizer, thus generating a set of modified voltage states, where each of the modified voltage states is taken from a set of L possible voltage states.

Basically, this variant is an application of the AGC to the read threshold voltages values of the M-quantizer, rather than to the M-quantized signal.

Specifically, step 152 includes reading a set of cells using M quantization values $v_0$ to $v_{M-1}$. Step 154 includes computing the gain g. Step 155 includes obtaining the L baseline read threshold voltage levels $V_{TH1}$ to $V_{TH7}$. Note that these examples involve eight data states as an illustration. Any number of states may be used, including 4, 8 16, 32 or more states. Step 156 include calculating L gain-adjusted read threshold voltage levels $L_1 = V_{TH1}/g$ to $L_7 = V_{TH7}/g$. At point "A", an alternative approach is provided in FIG. 1*i*. Step 158 includes assigning cells to states based on the gain-adjusted read threshold voltage levels.

For example, a counter "i" can be initialized to zero at step 160. At decision block 162, if the non-gain-adjusted quantization value $v_i$ for a cell is less than $L_1$, then the cell is assigned to state 0 (step 164). At decision block 166, if $L_1 <= v_i < L_2$, then the cell is assigned to state 1 (step 168). At decision block 170, if $L_2 <= v_i < L_3$, then the cell is assigned to state 2 (step 172). At decision block 174, if $L_3 <= v_i < L_4$, then the cell is assigned to state 3 (step 176). At decision block 178, if $L_4 <= v_i < L_5$, then the cell is assigned to state 4 (step 180). At decision block 182, if $L_5 <= v_i < L_6$, then the cell is assigned to state 5 (step 184). At decision block 186, if $L_6 <= v_i < L_7$, then the cell is assigned to state 6 (step 188). If decision block 186 is false, then the cell is assigned to state 7 (step 192). At decision step 190, if the last (M−1)st gain-adjusted quantization value has not yet been reached, the counter "i" is incremented at block 194 and the assignment process starting at step 162 is repeated. If the last gain-adjusted quantization value has been reached, at decision step 190, the process ends at step 196.

Another embodiment involves reading the same plurality of cells or a larger plurality of cells using L−1 new read threshold voltage levels computed as a result of step-3 of the last described embodiment. In this case, $\log_2(L)$ represents the number of bits stored in each memory cell. In that case those L−1 new/modified read threshold voltage levels are not necessarily a subset of the M threshold voltage levels. This approach is discussed in FIG. 1*i*.

FIG. 1*i* depicts a read process in which storage elements are read based on gain-adjusted read threshold voltage levels. The process continues from transition point "A" in FIG. 1*h*. Step 200 includes beginning a read process of the cells. As mentioned, this could be the same set of cells which was used in step 152 of FIG. 1*h*, or a different set of cells. Step 202 involves beginning to apply a series of control gate read voltages $V_{CGR}$ to the cells which are being read, e.g., along a common selected word line. The different $V_{GCR}$ values may be $V_{TH1}/g$ to $V_{TH7}/g$.

When $V_{TH1}/g$ is applied (decision block 204), if a cell is conductive, it is assigned state 0 (step 206). When $V_{TH2}/g$ is applied (decision block 208), if a cell is conductive, it is assigned state 1 (step 210). When $V_{TH3}/g$ is applied (decision block 212), if a cell is conductive, it is assigned state 2 (step 214). When $V_{TH4}/g$ is applied (decision block 216), if a cell is conductive, it is assigned state 3 (step 218). When $V_{TH5}/g$ is applied (decision block 220), if a cell is conductive, it is assigned state 4 (step 222). When $V_{TH6}/g$ is applied (decision block 224), if a cell is conductive, it is assigned state 5 (step 226). When $V_{TH7}/g$ is applied (decision block 228), if a cell is conductive, it is assigned state 6 (step 230). If decision block 228 is false, the cell is assigned to state 7 (step 234). The process ends at step 232.

Computing the Gain

The mathematical concept of a norm may be used to better understand the computation of the gain.

Definition of Norm

The mathematical notion of a norm of a vector, gives a formal meaning to the intuitively used concept of magnitude of a vector, also referred to as a magnitude measure.

In order for a function to be a norm function it has to satisfy three properties (all very intuitive):

1. It must be positive (or 0) (Magnitudes are all non-negative).
2. It must be Multiplicative: $\text{norm}(\alpha \cdot x) = |\alpha| \, \text{norm}(x)$, i.e. if all coordinates of a vector x are multiplied by the same scalar $\alpha$, then the norm is multiplied by $|\alpha|$.
3. Triangle inequality: $\text{norm}(x+v) \leq \text{norm}(x) + \text{norm}(y)$ (when adding two vectors, the magnitude of the sum cannot exceed the sum of the magnitudes of the components).

The three most common norms for a vector $\underline{x} = (x_1, x_2, \ldots, x_n)$ are:

1. The Euclidian norm:

$$Enorm(\underline{x}) = \|x\|_2 = \sqrt{\sum_i x_i^2}$$

2. The $L_1$ norm defined by:

$$L_1 norm(\underline{x}) = \|x\|_1 = \sum_i |x_i|$$

3. The $L_\infty$ norm defined by:

$$L_\infty norm(\underline{x}) = \|x\|_\infty = \max_i \{|x_i|\}$$

Other norms, which are used in mathematical analysis include the p-norms defined by:

$$\|x\|_p = \left(\sum_i |x_i|^p\right)^{1/p} \quad (1.1)$$

Examples for Gain Computation

Several example methods for computing the gain are presented. These methods are considered as exemplary embodiments only and by no means are they exhaustive, as various other techniques may be used as well:

1. Each set of N read cells is assigned a representation vector from a predefined set of $M^N$ vectors since each cell may be given one of M values, and the total number of possible vectors in the set is $M^N$. For a set of cells, with known programmed values $\underline{c} = (c_1, c_2, \ldots, c_n)$ compute the norm of $\underline{c}$, $\|\underline{c}\|$ (according to, e.g., any favorite norm). Lower case n in the example has the same role as capital N above. This norm is the baseline norm, $E_{FRESH}$, to be reached by the gain factor. For the same set of cells, compute $\|\underline{v}\|$, or $E_{LEAK}$, which is the norm of the vector of read threshold voltage values $\underline{v} = (v_1, v_2, \ldots, v_n)$ from the flash memory. Define g by:

$$g = \|\underline{c}\|/\|\underline{v}\| = E_{FRESH}/E_{LEAK} \quad (1.2)$$

Multiplying the vector $\underline{v}$ by g, will generate the vector $g \times \underline{v}$, which has the same norm as the original vector of programmed values $\underline{c}$, even though the individual entries may differ.

Here, the programmed values $\underline{c}$ are actually the read values (from the high resolution M-quantization) obtained immediately after programming the cells the first time, at which time the device is fresh. Since the verify voltage levels, i.e., the threshold voltage levels employed when the device is programmed, are known and since the distribution of cells in a fresh device is also known, then the baseline norm can be computed off-line during manufacturing or even once during the design time of a given flash technology. It is also possible to compute the baseline norm after manufacturing, when the memory device is in the possession of the end user.

The read threshold voltage values $\underline{v}$ are the high resolution (using M-quantization) values read from the device when performing the read operation. In order to transform those read values closer to their baseline values, we compute their norm, $E_{LEAK}$, use the baseline stored norm $E_{FRESH}$ (the one that is measured in production or during design) to compute the value g and then multiply each cell by g in order to move it back to the corresponding baseline voltage.

Here, we can use a curve or whatever function that would be used for the multiplication (or even translation without multiplication at all) in order to compensate for the distortion cause by the P/E and D/R.

Note, however, that since usually in flash devices Gray code mapping is employed, then, after reading we have to translate the read values from Gray to decimal, do the multiplication (or apply whatever distortion compensation function is chosen) and then translate back the result to Gray code in order to reconstruct the information bits.

With respect to the whether $\underline{c}$ and $\underline{v}$ have the same vector length, this depends on the way the norm is defined. If the norm is not normalized by the number of cells (n), then they have the same length. If there is a sufficiently large number of cells such that the statistics remain the same and the norm value is normalized by the number of cells (n) employed to compute the norm, then 'n' for "programmed cells" may be different than the 'n' for "read cells." For example, if we measure the reference norm over 20K cells and compute it as $$\|c\| = \sqrt{\frac{1}{n}\sum_i c_i^2}$$

and when we do a read we use only 10K cells to compute $$\|v\| = \sqrt{\frac{1}{m}\sum_i v_i^2},$$

where n=20K and m=10K, then we can still compute g as $\|c\|/\|v\|$, so in this case m is not equal to n.

2. A second method to compute g, is to find a scalar, $\alpha$, which minimizes the norm of the difference between $\underline{c}$ and $g \times \underline{v}$. Expressing this method in formal mathematical terms:

$$g = \operatorname*{argmin}_{\alpha} \|\underline{c} - \alpha \cdot \underline{v}\|. \quad (1.3)3$$

A third approach is to find a factor g, such that the vector $g \times \underline{v}$ satisfies a certain probability distribution, similar to the distribution of the original vector $\underline{c}$.

Note that the first method and the third method may be computed for any chosen set of cells as long as the target norm or target probability distributions are known. The second method requires knowledge of the programmed states for the set of cells; therefore it is applicable with a set of predefined cells.

Further, note the following regarding what new information or changes need to be implemented in the memory device to carry out the invention. This depends on what norm function is implemented and how the tasks are divided between the software and hardware. However, for the simplest case where we use a single linear value g, the norm of the reference is obtained during a design time and kept in the software package. A special hardware block can be added to be employed after reading the high resolution values and placing them in a RAM. See FIG. 5, discussed further below, which includes a process 521 for hardware/software functions and a RAM 522. The hardware processing block is set to:

1. Translate the read values from Gray code to decimal.
2. Multiply the decimal values by g (which is computed in the background by software) and then
3. Quantize the modified values into one of L values and
4. Translate the quantized values back into Gray code in the required resolution (L levels).

Then, further processing continues as otherwise would have been done, such as error correction code (ECC) decoding. In terms of flash hardware, no change is required for this embodiment.

The reference norm can be obtained during the manufacturing stage; however, the gain value itself (g) is obtained in the device in background processing that includes reading in high resolution, translating from Gray code to decimal, computing the norm and dividing the norm by the reference norm (which is obtained during manufacturing, for example). This background processing is done on the actual device and should be near the same time as the actual read so as to capture the condition of the cells at point as close as possible to the point in which they are actually read and decoded. As any procedures performed in background, they may be handled by software, hardware or a combination thereof, depending on the frequency with which they are activated. One approach is to do it all by hardware if the simple linear model is used. If the gain function is a curve or a non linear function, then more complex computations are required and in this case it may be preferable for software to be involved.

The gain can be determined and applied according to two main triggers:

1. Every predefined interval that includes a sufficient change in D/R and P/E; or
2. When the ECC fails to decode, or otherwise some ECC metric exceeds a threshold which indicates difficulty in decoding, which indicates that the gain employed is not optimal.

The gain need not be adjusted for every read operation.

The gain can be determined once and applied for each of a number of subsequent read operation, as long as these read operation are performed on data that has substantially the same P/E and D/R characteristic as the data from which the gain was obtained from. For example, the same gain can be applied to the same block, or to a block in the same set, while the set of blocks has approximately the same number of P/E cycles and the same D/R time after the P/E cycles.

The gain can also be re-determined after a number of P/E cycles such as after every 100-1000 cycles. The gain typically should be re-determined more often for memory devices in which more data states are used, e.g., more often for sixteen states (four bits per cell) vs. eight states (three bits per cell). Also, the gain may be re-determined more often depending on the total number of P/E cycles. For instance, the frequency of updating the gain can be greater when the device is fresh (e.g., update gain after 100, 200, 400, 800, 1600 P/E cycles), or greater when the device is cycled (e.g., update gain after 1000, 2000, 2500, 2750 P/E cycles), depending on the characteristics of the memory device.

Results

Figure 1J:
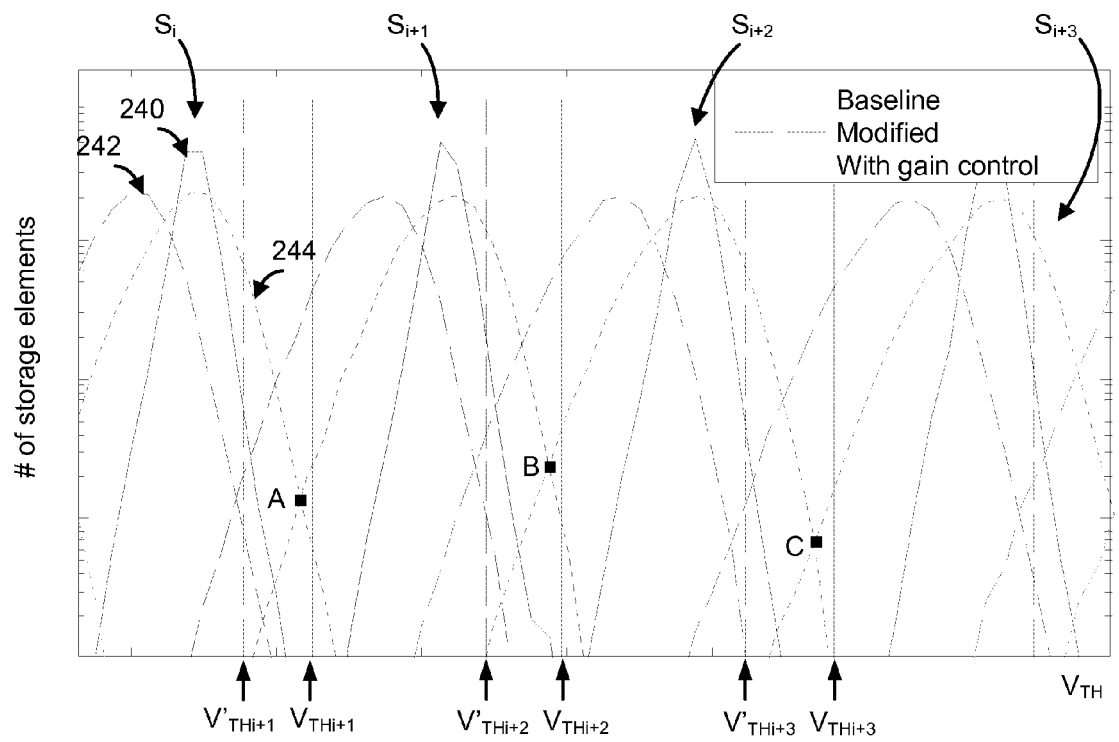
FIG. 1j depicts a threshold voltage distribution of a set of storage elements, comparing a baseline distribution, a modified distribution with P/E cycles and data retention (D/R) loss, and a distribution with gain control, for four states.

FIG. 1*j* shows examples of applying the Gain Control method for adjusting the distributions of the threshold voltage values, or adjusting the read threshold voltage levels. In particular, FIG. 1*j* depicts a portion of a threshold voltage distribution of a set of storage elements, comparing a baseline distribution, a modified distribution with program erase cycles (P/E) and data retention (D/R) loss, and a distribution with gain control.

The solid curves 240 represent original CVDs (cell voltage distributions) of a fresh flash memory, while the dashed curves 242 represent the CVD of read threshold voltage values from the flash after P/E (program erase cycling) and data retention effects are included. After applying the Gain control method, the resulting gain-adjusted CVD is represented by the dotted curve 244, which can be read with a good accuracy by the original read threshold voltage levels (represented by the solid lines). For example, states $S_i$ through $S_{i+4}$, the read threshold voltage levels $V_{THi+1}$, $V_{THi+2}$ and $V_{THi+3}$, and $V'_{TH+1}$, $V'_{THi+2}$ and $V'_{THi+3}$, are depicted. By comparing a valley region of the gain-adjusted CVD, represented by points A, B and C, to the original read threshold voltage levels $V_{TH2}$, $V_{TH3}$ and $V_{TH4}$, it can be seen that good read accuracy can be obtained by reading the gain-adjusted CVD using the original read threshold voltage levels.

The alternative solution of multiplying the baseline read threshold voltage levels by a gain factor is represented by the dotted lines 244, and according to this variant, the read voltages can be adjusted to the actual distribution of the flash.

Generalization

The techniques discussed herein can be generalized to generate a gain vector g, i.e., modify each read threshold voltage value from the memory as a function of the read threshold voltage value. An option for a criterion for a gain vector is:

$$\underline{g} = \underset{\alpha}{\operatorname{argmin}} \|\underline{c} - \underline{\alpha}(\underline{v})\| \quad (1.4)$$

Here:

$$\underline{\alpha}(\underline{v}) = (\alpha_1(v_1), \alpha_2(v_2), \ldots, \alpha_n(v_n)) \quad (1.5)$$

Another embodiment involves approximating a certain probability distribution. For example, if it is desired to approximate the uniform distribution, choose g such that the number of elements of g(v) between any two consecutive read threshold voltage levels of the L-quantizer (as well as the number of elements below the first threshold voltage level, and the number of elements above the (L−1)th threshold voltage level) are more or less equal, e.g., within some specified difference, e.g., 5, 10, 15, 20, 25%, and so forth The present invention is advantageous, as it allows for computing the read threshold voltage levels from a single high resolution read of cells for which the programmed state is known or unknown in advance. It also allows for setting new read threshold voltage levels even in the case of overlap between the CVD of cells in adjacent states.

Overview of Example Memory System

Figure 2A:
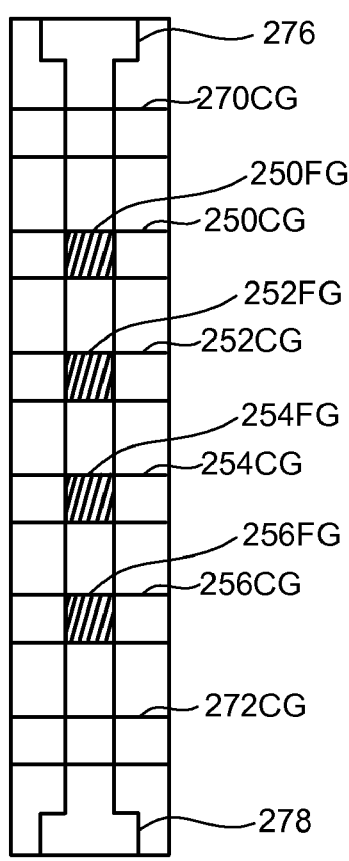
FIG. 2a is a top view of a NAND string.
Figure 2B:
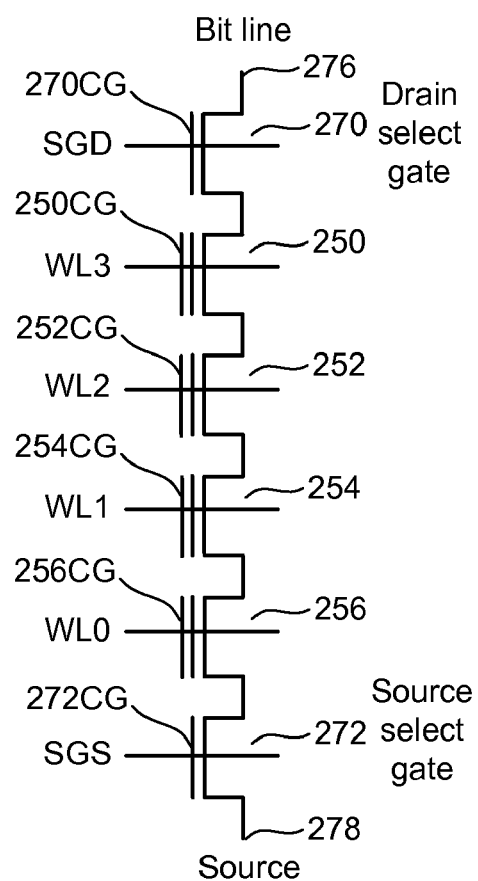

One example of a memory system suitable for implementing the present invention uses the NAND flash memory structure, which includes arranging multiple transistors in series between two select gates. The transistors in series and the select gates are referred to as a NAND string. FIG. 2*a* is a top view showing one NAND string. FIG. 2*b* is an equivalent circuit thereof. The NAND string depicted in FIGS. 2*a* and 2*b* includes four transistors, 250, 252, 254 and 256, in series and sandwiched between a first select gate 270 and a second select gate 272. Select gate 270 gates the NAND string connection to bit line 276. Select gate 272 gates the NAND string connection to source line 278. Select gate 270 is controlled by applying the appropriate voltages to control gate 270CG. Select gate 272 is controlled by applying the appropriate voltages to control gate 272CG. Each of the transistors 250, 252, 254 and 256 has a control gate and a floating gate. Transistor 250 has control gate 250CG and floating gate 250FG. Transistor 252 includes control gate 252CG and floating gate 252FG. Transistor 254 includes control gate 254CG and floating gate 254FG. Transistor 256 includes a control gate 256CG and floating gate 256FG. Control gate 250CG is connected to word line WL3, control gate 252CG is connected to word line WL2, control gate 254CG is connected to word line WL1, and control gate 256CG is connected to word line WL0. The control gates can also be provided as portions of the word lines. In one embodiment, transistors 250, 252, 254 and 256 are each storage elements, also referred to as memory cells. In other embodiments, the storage elements may include multiple transistors or may be different than that depicted. Select gate 270 is connected to select line SGD (drain select gate). Select gate 272 is connected to select line SGS (source select gate).

Figure 3:
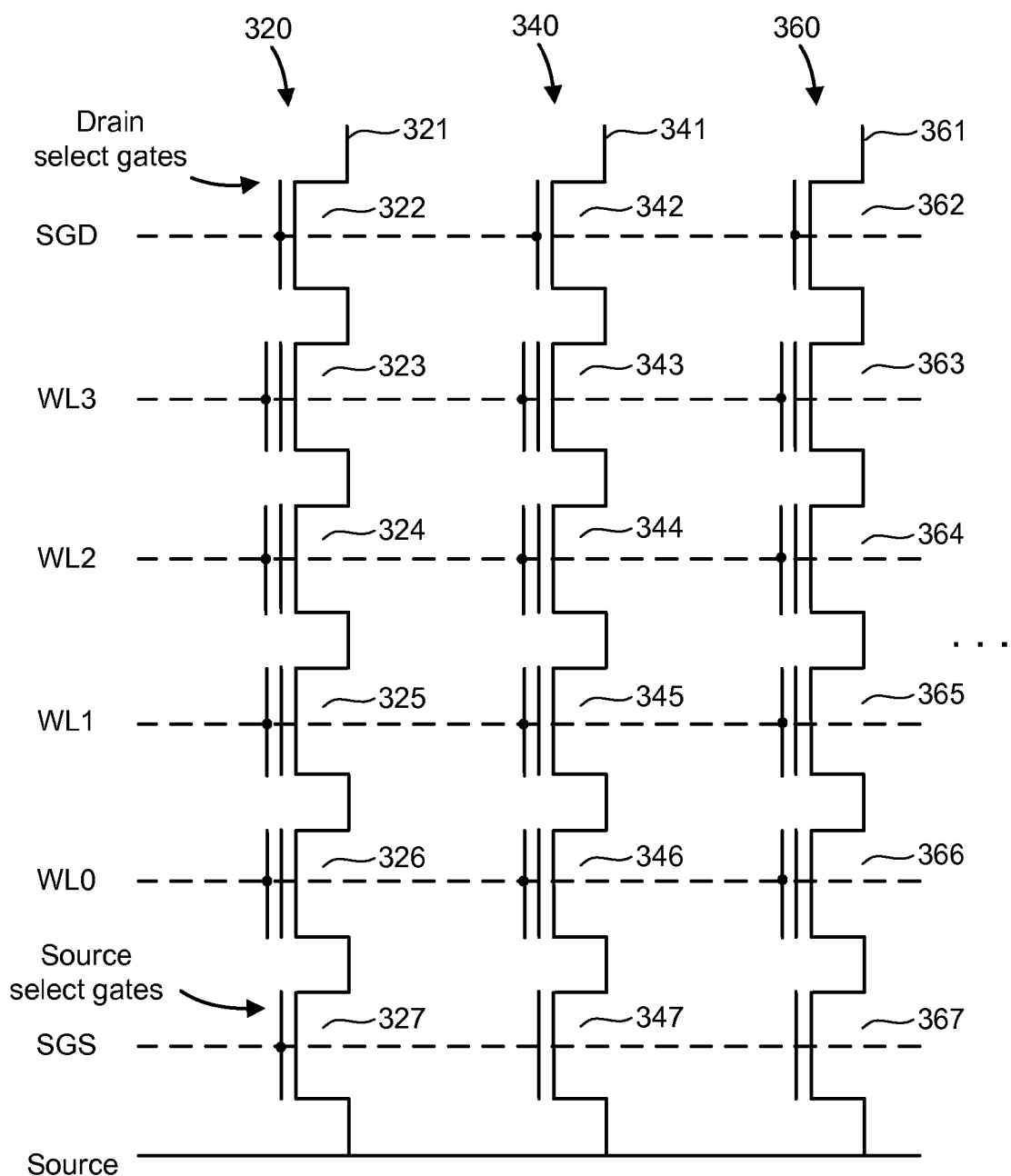
FIG. 3 is a block diagram of a block of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprises the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
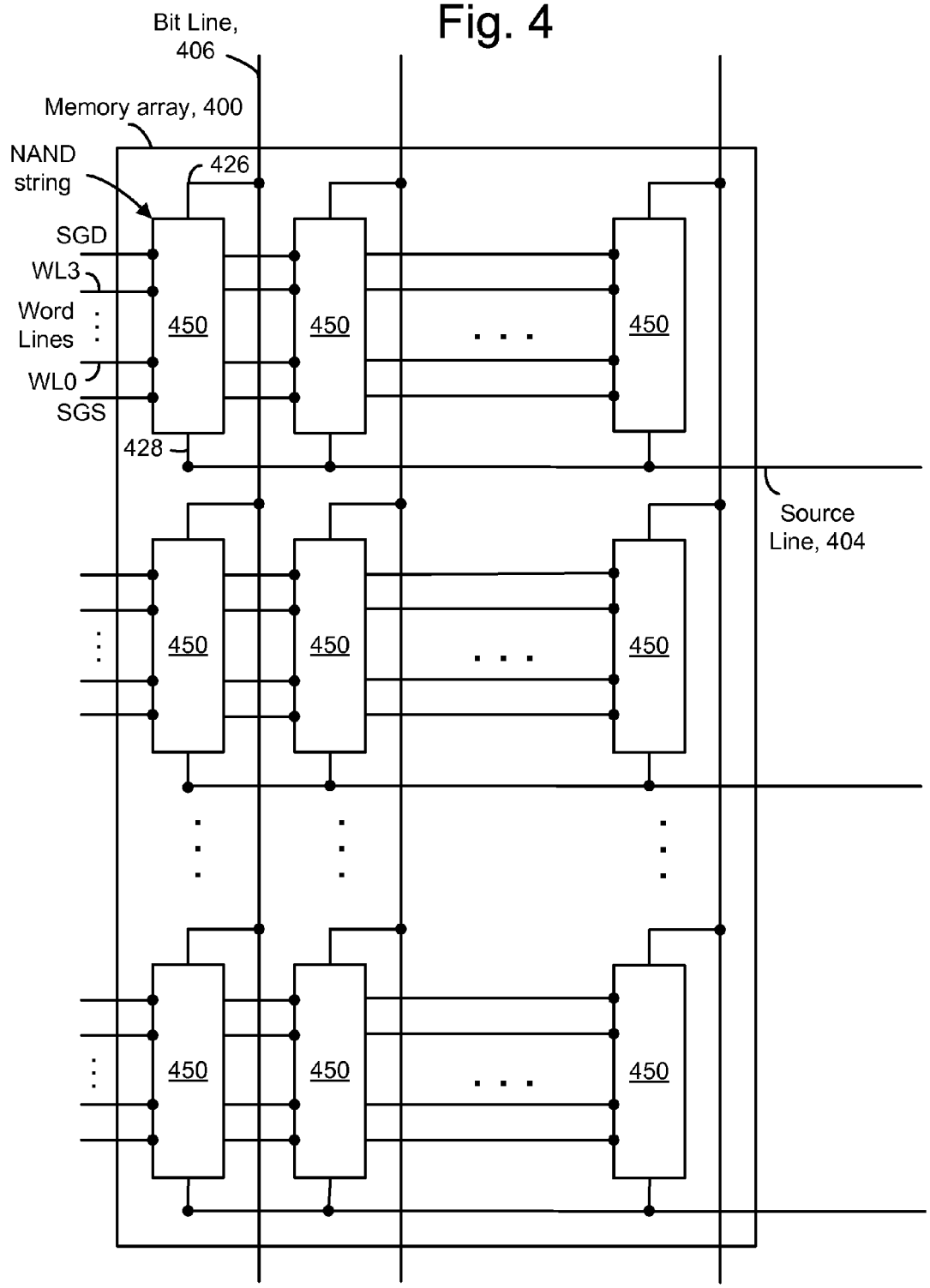
FIG. 4 is a block diagram of a memory array of NAND flash storage elements.

FIG. 4 is a block diagram of an array of NAND flash storage elements, such as those shown in FIGS. 2a and 2b. Along each column, a bit line is coupled to the drain terminal of the drain select gate for the associated NAND string. For example, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data may also be provided. A large number of pages form a block, anywhere from 8 pages, for example, up to 32, 64, 128 or more pages. In some embodiments, a row of NAND strings comprises a block.

Figure 5:
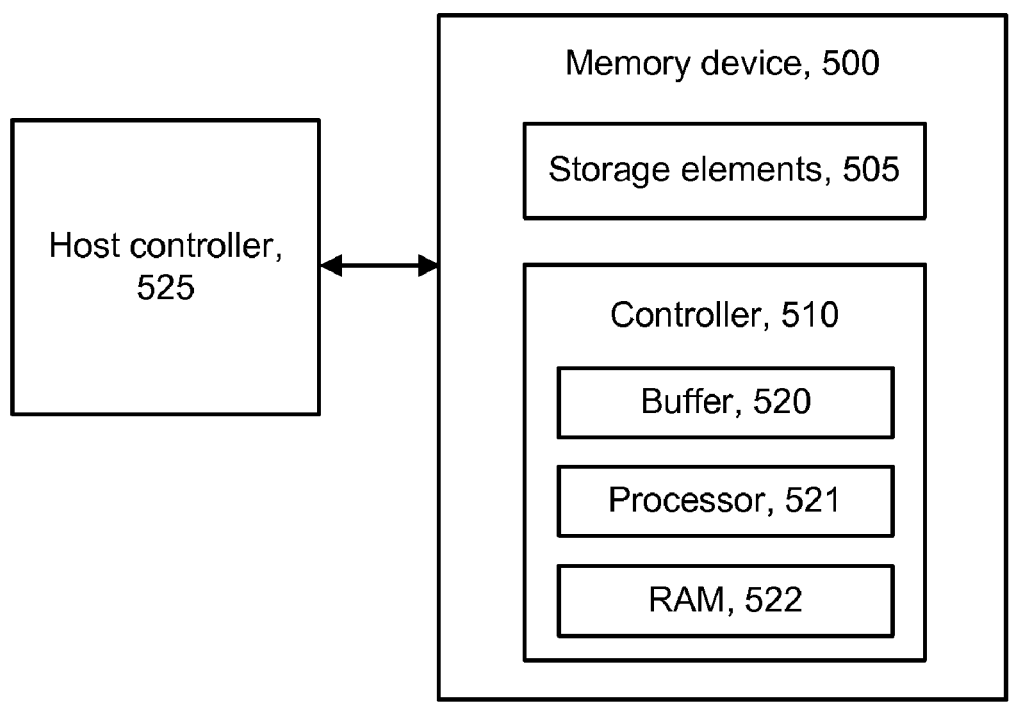
FIG. 5 depicts an overview of a host controller and a memory device.

FIG. 5 depicts an overview of a host controller and a memory device in a storage system. The memory device alone may also be considered to be a storage system. Storage elements 505 can be provided in a memory device 500 which has its own controller 510 for performing operations such as programming/verifying and reading. The memory device may be formed on a removable memory card or USB flash drive, for instance, which is inserted into a host device such as a laptop computer, digital camera, personal digital assistant (PDA), digital audio player or mobile phone. The host device may have its own controller 525 for interacting with the memory device, such as to read or write user data. For example, when reading data, the host controller can send commands to the memory device indicating an address of user data to be retrieved. The memory device controller converts such commands into command signals that can be interpreted and executed by control circuitry in the memory device. The host controller 525 may be considered to be an entity which is outside of, or external to, the memory device. The memory device may include one or more memory die, for instance, and the host controller may be outside the one or more memory die.

The memory device responds to a read command by reading the data from the storage elements and making it available to the host controller. In one possible approach, the memory device stores the read data in the buffer 520 and informs the host controller of when the data can be read. The host controller responds by reading the data from the buffer and sends another command to the memory device to read data from another address. For example the data may be read page by page. The host controller may process the read data to determine a threshold voltage distribution of the storage elements of the memory device. In another approach, control circuitry of the memory device determines the threshold voltage distribution. Further details of example embodiments of a memory device are provided below.

A typical memory system includes an integrated circuit chip that includes the controller 510, and one or more integrated circuit chips that each contains a memory array and associated control, input/output and state machine circuits. The memory device may be embedded as part of the host system, or may be included in a memory card that is removable and insertable into a mating socket of a host system. Such a card may include the entire memory device, or the controller and memory array, with associated peripheral circuits, may be provided in separate cards.

The controller 510 also includes a processor 521 and a local memory such as a RAM 522 for carrying out the functionality described herein, including calculating and applying a gain value g, as discussed previously. However, note that intelligence for carrying out the techniques discussed herein can be provided in the host and/or the memory device.

Figure 6:
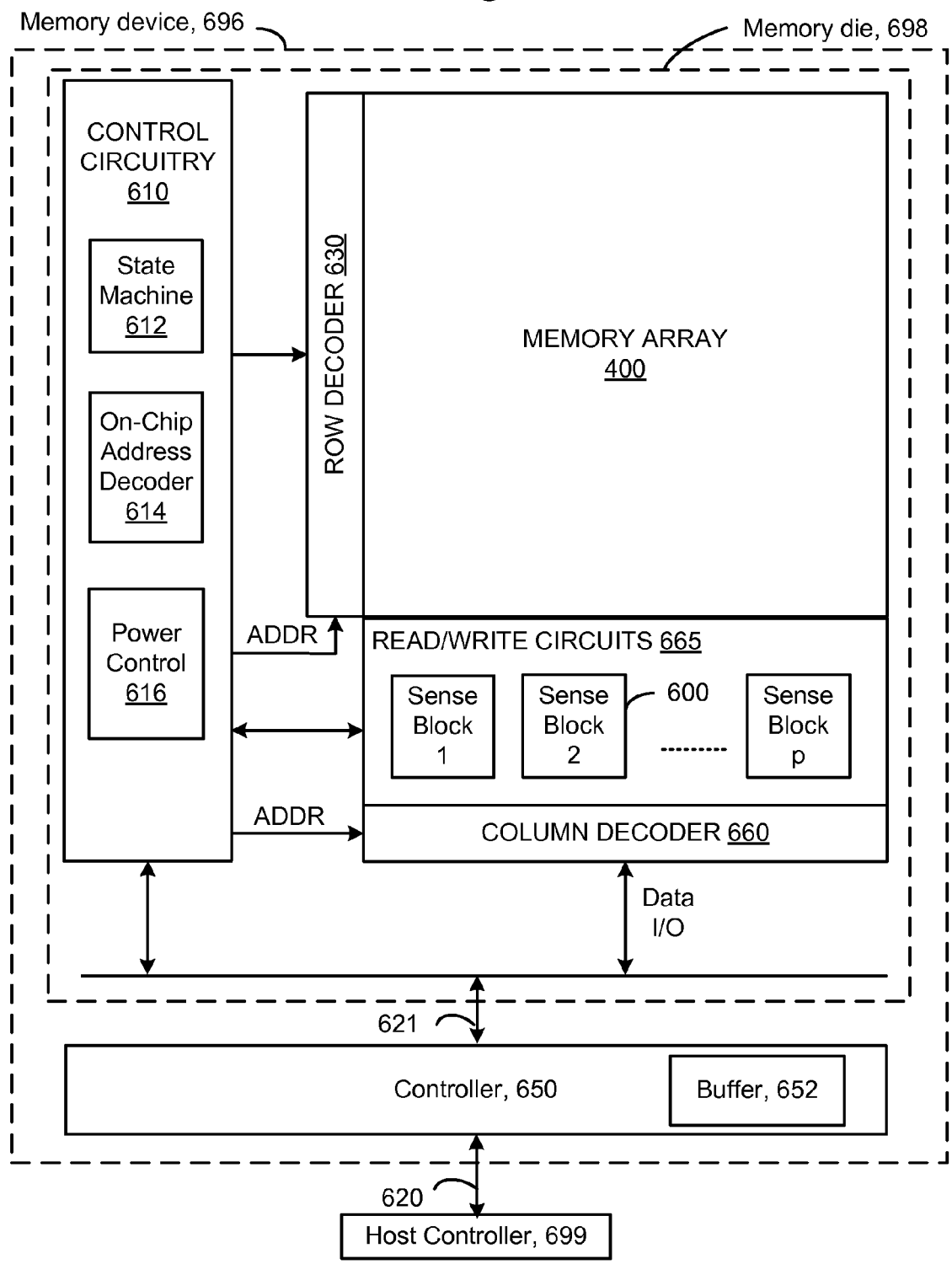
FIG. 6 is a block diagram of a non-volatile memory system using single row/column decoders and read/write circuits.

FIG. 6 is a block diagram of a non-volatile memory system using single row/column decoders and read/write circuits. The diagram illustrates a memory device 696 having read/write circuits for reading and programming a page of storage elements in parallel, according to one embodiment of the present invention. Memory device 696 may include one or more memory die 698. Memory die 698 includes a two-dimensional array of storage elements 400, control circuitry 610, and read/write circuits 665. In some embodiments, the array of storage elements can be three dimensional. The memory array 1400 is addressable by word lines via a row decoder 630 and by bit lines via a column decoder 660. The read/write circuits 665 include multiple sense blocks 600 and allow a page of storage elements to be read or programmed in parallel. Typically a controller 650 is included in the same memory device 696 (e.g., a removable storage card) as the one or more memory die 698. Commands and Data are transferred between the host and controller 650 via lines 620 and between the controller and the one or more memory die 698 via lines 621.

The control circuitry 610 cooperates with the read/write circuits 665 to perform memory operations on the memory array 400. The control circuitry 610 includes a state machine 612, an on-chip address decoder 614 and a power control module 616. The state machine 612 provides chip-level control of memory operations. For example, the state machine may be configured to perform read and verify processes. The on-chip address decoder 614 provides an address interface between the host or a memory controller to the hardware address used by the decoders 630 and 660. The power control module 616 controls the power and voltages supplied to the word lines and bit lines during memory operations. For example, the power control module 616 can provide a control gate read voltage to a selected word line, and read pass voltages to unselected word lines, for use during read operations and in determining a threshold voltage distribution of a set of storage elements. The power control module 616 may include one or more digital-to-analog converters, for instance.

In some implementations, some of the components of FIG. 6 can be combined. In various designs, one or more of the components (alone or in combination), other than storage element array 400, can be thought of as a managing or control circuit. For example, one or more managing or control circuits may include any one of, or a combination of, control circuitry 610, state machine 612, decoders 614/660, power control 616, sense blocks 600, read/write circuits 665, controller 650, host controller 699, and so forth The data stored in the memory array is read out by the column decoder 660 and output to external I/O lines via the data I/O line and a data input/output buffer 652. Program data to be stored in the memory array is input to the data input/output buffer 652 via the external I/O lines. Command data for controlling the memory device are input to the controller 650. The command data informs the flash memory of what operation is requested. The input command is transferred to the control circuitry 610. The state machine 612 can output a status of the memory device such as READY/BUSY or PASS/FAIL. When the memory device is busy, it cannot receive new read or write commands.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of reading data from a unit of a flash memory device, the method comprising:
   reading data from cells of the flash using a first quantizer with M−1 read threshold voltage levels, thereby assigning to each read cell a representation value from a predefined set of M values;
   modifying the representation value of each cell in the read unit, thereby generating a modified representation value for each cell; and
   assigning a read threshold voltage level for each cell, each said read threshold voltage level computed as a function of said modified representation value associated with the cell and a set of predefined L−1 read threshold voltage levels, where L is less than M.

2. The method of claim 1, wherein said modifying step comprises modifying said representation value according to a function that depends on read threshold values from a set of cells, thereby generating a modified representation number for each cell.

3. The method of claim 2 wherein said set of cells is a set of cells containing data stored in the flash.

4. The method of claim 2 wherein said set of cells is separate from the cells containing data of the flash.

5. The method of claim 2, wherein said modifying step comprises dividing said representation value by a function of a magnitude measure of said set of cells, thereby generating said modified representation value for each cell.

6. The method of claim 5 further comprising multiplying said modified representation value by a value R.

7. The method of claim 6, wherein R is a function of a magnitude measure of a set of reference values associated with said set of cells.

8. The method of claim 5, wherein said magnitude measure is a Euclidian norm 9. The method of claim 5, wherein said magnitude measure is an $L_1$ norm.

10. The method of claim 5, wherein said magnitude measure is an $L_\infty$ norm.

11. The method of claim 1 wherein L is a power of 2.

12. The method of claim 11 wherein each said cell read from the flash device is programmed to one of L states, representing $\log_2(L)$ bits.

13. A method of reading data from a unit of a flash memory device, the method comprising:
    reading data from cells of the flash using a first quantizer with M−1 read threshold voltage levels, thereby assigning to each set of N read cells a representation vector from a predefined set of $M^N$ vectors;
    modifying the representation vector of each set of N cells in the read unit, thereby generating a modified representation vector for each set of N cells;
    assigning a vector of read values for each set of N cells, each said vector of read values is computed as a function of said modified representation vector associated with the set of N cells and a set of predefined L read threshold vectors, where L is less than $M^N$.

14. The method of claim 13 wherein said L is a power of 2.

15. The method of claim 14 wherein each said set of N cells read from the flash device is programmed to one of L states, representing $\log_2(L)$ bits.

* * * * *